United States Patent
Denny et al.

(10) Patent No.: US 6,621,882 B2
(45) Date of Patent: Sep. 16, 2003

(54) METHOD AND APPARATUS FOR ADJUSTING THE CLOCK DELAY IN SYSTEMS WITH MULTIPLE INTEGRATED CIRCUITS

(75) Inventors: Ronald R. Denny, Brooklyn Center, MN (US); Chris H. Simon, Minneapolis, MN (US); Joan E. Zak, Savage, MN (US)

(73) Assignee: General Dynamics Information Systems, Inc., Bloomington, MN (US)

( * ) Notice: Subject to any disclaimer, the term of this patent is extended or adjusted under 35 U.S.C. 154(b) by 346 days.

(21) Appl. No.: 09/798,155

(22) Filed: Mar. 2, 2001

(65) Prior Publication Data

US 2003/0026367 A1 Feb. 6, 2003

(51) Int. Cl.[7] .......................... H04L 7/00; H04L 25/36; H04L 25/40
(52) U.S. Cl. .................. 375/371; 713/400; 713/401
(58) Field of Search .................. 375/371; 713/400, 713/401, 503

(56) References Cited

U.S. PATENT DOCUMENTS

| | | | |
|---|---|---|---|
| 4,546,269 A | 10/1985 | Johnson | 307/269 |
| 4,714,924 A | 12/1987 | Ketzler | 340/825.21 |
| 5,118,975 A | 6/1992 | Hillis et al. | 307/602 |
| 5,305,453 A | 4/1994 | Boudry et al. | 395/550 |
| 5,442,776 A | 8/1995 | Masleid et al. | 395/550 |
| 5,608,645 A * | 3/1997 | Spyrou | 364/491 |
| 5,692,165 A | 11/1997 | Jeddeloh et al. | 395/551 |
| 5,710,910 A | 1/1998 | Kehl et al. | 395/551 |
| 5,737,589 A | 4/1998 | Doi et al. | 395/558 |
| 5,878,097 A | 3/1999 | Hase et al. | 375/371 |
| 5,945,862 A | 8/1999 | Donnelly et al. | 327/278 |
| 6,002,282 A | 12/1999 | Alfke | 327/165 |
| 6,016,282 A | 1/2000 | Keeth | 365/233 |
| 6,029,250 A | 2/2000 | Keeth | 713/400 |
| 6,417,715 B2 * | 7/2002 | Hamamoto et al. | 327/291 |

OTHER PUBLICATIONS

Using the Virtex Delay–Locked Loop, *Xilinx*, XAPP 132 (v.2.3) Sep. 20, 2000.

* cited by examiner

Primary Examiner—Mohammad H. Ghayour
(74) Attorney, Agent, or Firm—Jenner & Block, LLC

(57) ABSTRACT

An apparatus and method for adjusting the clock delay in systems with multiple integrated circuits has a controller, a programmable clock generator and a plurality of integrated circuits, each integrated circuit including a data flip-flop, a programmable delay and a clock-fanout tree, wherein the clock delay in the integrated circuits is adjusted to match the inherent delay in the integrated circuit having the longest inherent delay.

13 Claims, 3 Drawing Sheets

METHOD AND APPARATUS FOR ADJUSTING THE CLOCK DELAY IN SYSTEMS WITH MULTIPLE INTEGRATED CIRCUITS

This invention was made with U.S. Government support under contract (number MDA904-99G-0016/0001 awarded by the Maryland Procurement Office. The U.S. Government has certain rights to the invention.

BACKGROUND OF THE INVENTION

1. Field of the Invention

The present invention relates generally to systems having multiple integrated circuits, and more particularly to maintaining synchronization in such systems by adjusting the delay of the clock signal distributed in each integrated circuit.

2. Description of the Related Art

The performance of electronic systems having multiple integrated circuits ("ICs") is largely dependent on the ability of the system to transmit digital data between ICs quickly and efficiently. To maximize speed and efficiency in these systems, each IC in the system can be synchronized to a common clock signal, or reference clock. When each IC in the system is synchronized to the same reference clock, the read and write functions of each IC can be coordinated by a common controller, that coordinates the operation of the ICs based on the rising or falling edge of the reference clock signal.

Because the synchronization of the system is dependent on a reference clock signal, it is essential that the reference clock signal is accurately distributed to each IC in the system. Typically, each IC in the system has one or more clock terminals which receive the reference clock signal. The reference clock signal is then distributed to each of the clocked circuit elements within the IC.

Due to the physical properties of the ICs, the reference clock signal is delayed as it is distributed to each circuit element in each IC. In other words, a rising edge of the reference clock signal arrives at the clocked circuitry of an IC some finite time later than it was received at the clock terminals of that IC. This delay is often referred to as inherent delay because it is due to the physical properties and design of the IC.

Inherent delay in the distribution of the reference clock signal in each IC would not be a problem if each IC in the system had the identical inherent delay. Due to differences in the physical properties of individual ICs, however, inherent delays vary from IC to IC. Even two ICs of the same make and model can have different inherent delays because of, for example, variables in the manufacturing process. It is difficult to economically and practically design and manufacture ICs with identical inherent delays. Therefore, some method and apparatus is needed to compensate for the varying inherent delays in the ICs to maintain synchronization in the system.

One existing device for compensating for clock delay in multiple IC systems is a delay-locked loop ("DLL"). A DLL is a device resident in each IC that continuously adjusts the clock delay in that IC. A DLL typically consists of a variable delay line and control logic. The variable delay line produces a delayed version of the reference clock. The delayed version of the reference clock is distributed to all clocked elements in the IC and to a clock feedback terminal. The control logic samples the reference clock as well as the clock signal at the feedback terminal in order to adjust the delay line. The variable delay line of the DLL introduces delay into the reference clock signal until the rising edges of the reference clock are aligned to the rising edges of the clock signal sampled at the feedback terminal. Once aligned, there is zero phase delay between the reference clock signal and the clock signal sampled at the feedback terminal.

Another existing device for compensating for clock delay in multiple IC systems is a phase-locked loop ("PLL"). A PLL, like a DLL, is a device resident in each IC that continuously adjusts the clock delay in that IC. A PLL, like a DLL, compares the reference clock signal to the clock signal sampled at the feedback terminal. The PLL uses a voltage controlled oscillator to generate a clock signal that approximates the reference clock signal, but adjusts for the clock delay. The control logic adjusts the oscillator clock until the rising edges of the reference clock align with the rising edges of the clock signal sampled at the feedback terminal. Once aligned, there is zero phase delay between the reference clock signal and the clock signal sampled at the feedback terminal.

One limitation of existing methods and systems for adjusting clock delay is that they become misaligned if the frequency of the reference clock changes. PLLs and DLLs, for example, continuously adjust clock delay to maintain zero phase delay between the reference clock signal and the feedback clock signal. When the reference clock frequency changes, a phase delay results, and PLLs and DLLs must realign the reference and feedback clock signals. Realignment, however, is not instantaneous. It may take several clock cycles to realign the clock rising edges. During the finite period of time DLLs and PLLs take to adjust the clock delays in the ICs, the ICs in the system are not synchronized and cannot exchange data.

In many applications, however, it is necessary to instantaneously change the frequency of the reference clock. Therefore, the effectiveness of existing appartuses and methods in maintaining clock alignment is limited because they become temporarily misaligned during reference clock frequency changes.

Therefore, it would be desirable to provide a method and apparatus for adjusting the clock delay in systems with multiple ICs. It would also be desirable to provide a method and apparatus for adjusting the clock delay in systems with multiple ICs wherein the system will not become misaligned when the frequency of the reference clock changes.

SUMMARY OF THE INVENTION

A system in accordance with the present invention is able to adjust the clock delay in a system with multiple integrated circuits such that all the integrated circuits can be synchronized. The synchronization will not become misaligned when the frequency of the reference clock changes. The present invention also provides a method for accomplishing these objectives, as well as a method for identifying which of a group of integrated circuits has the longest inherent delay.

The apparatus for adjusting the clock delay in a system having multiple integrated circuits can include a clock generator for generating a reference (or a first) clock signal. A controller is used to control the frequency of the first clock signal. The apparatus also includes a means for creating a second clock signal derived from the first clock signal. For example, the second clock signal can simply be a delay of the first clock signal. The apparatus also includes a means for sampling the first clock signal at a time determined by the second clock signal. The sampling means can be, for example, a flip-flop or a latch. The flip-flop can have a data input terminal, a data output terminal and a clock input terminal. Finally, the apparatus includes a means for comparing the sampled first clock signal to a predetermined value. For example, if the apparatus uses a flip-flop clocked on the rising edge of a timing signal, the controller can determine whether the output of the flip-flop (which can be the first clock signal) is equal to a logic 0. In this way, the apparatus determines whether the delay in the second clock signal is long enough that the first clock signal has changed into the next logic state. This apparatus can be used to identify which integrated circuit has the longest inherent delay because the integrated circuit with the longest inherent delay will first cause this output.

A programmable clock generator can be used to generate the first clock signal. Each integrated circuit can include a programmable delay which can be programmed by the controller. Each integrated circuit can include a clock-fanout tree connected to the programmable delay. The clock-fanout tree can have at least one leaf terminal connected to the clock input terminal of the flip-flop.

If desired in a given application, the present invention also can be used to synchronize a plurality of integrated circuits by increasing the delay in the "faster" integrated circuits so that all the integrated circuits have the same delay as the inherent delay in the integrated circuit having the longest inherent delay. In such case, the programmable delays are programmed to increase the delay in each integrated circuit to synchronize all the integrated circuits.

A method for determining which of a plurality of integrated circuits has the longest inherent delay can begin by setting the delay settings in the programmable delays of the integrated circuits to an initial delay. The initial delay can be zero. A first clock signal is generated and routed to the integrated circuits. In each integrated circuit, a respective second clock signal is derived from the first clock signal. For example, the second clock signal can simply be a delay of the first clock signal. On each integrated circuit, the respective second clock signal is distributed to clocked elements on the integrated circuit. The first clock signal is set to an initial frequency such that the period of the first clock signal is greater than twice the maximum inherent delay of the integrated circuits. In each integrated circuit, the first clock signal is sampled at a time determined by the second clock signal. For example, the second clock signal can be used to clock a flip-flop which accepts at the data input the first clock signal. The flip-flop thus will output the current value of the first clock signal. The frequency of the first clock signal can be incrementally increased until such time that the output from, e.g., the flip-flop has a predetermined value. The first integrated circuit to reach that state has the longest inherent delay.

If desired, the remaining integrated circuits can then be programmed to be synchronized with the integrated circuit having the longest inherent delay. The frequency of the first clock signal is held constant while each integrated circuit is adjusted as appropriate. In particular, the programmable delay in the integrated circuit is incrementally increased until such time that the output first clock signal has the desired predetermined value. This is done in all the integrated circuits so that they all are synchronized to that integrated circuit having the longest inherent delay. Once synchronized in this manner, a change in the frequency of the first clock signal will not disturb the synchronization thereby providing benefits over prior art systems and methods.

DETAILED DESCRIPTION OF THE PREFERRED EMBODIMENT

Figure 1:
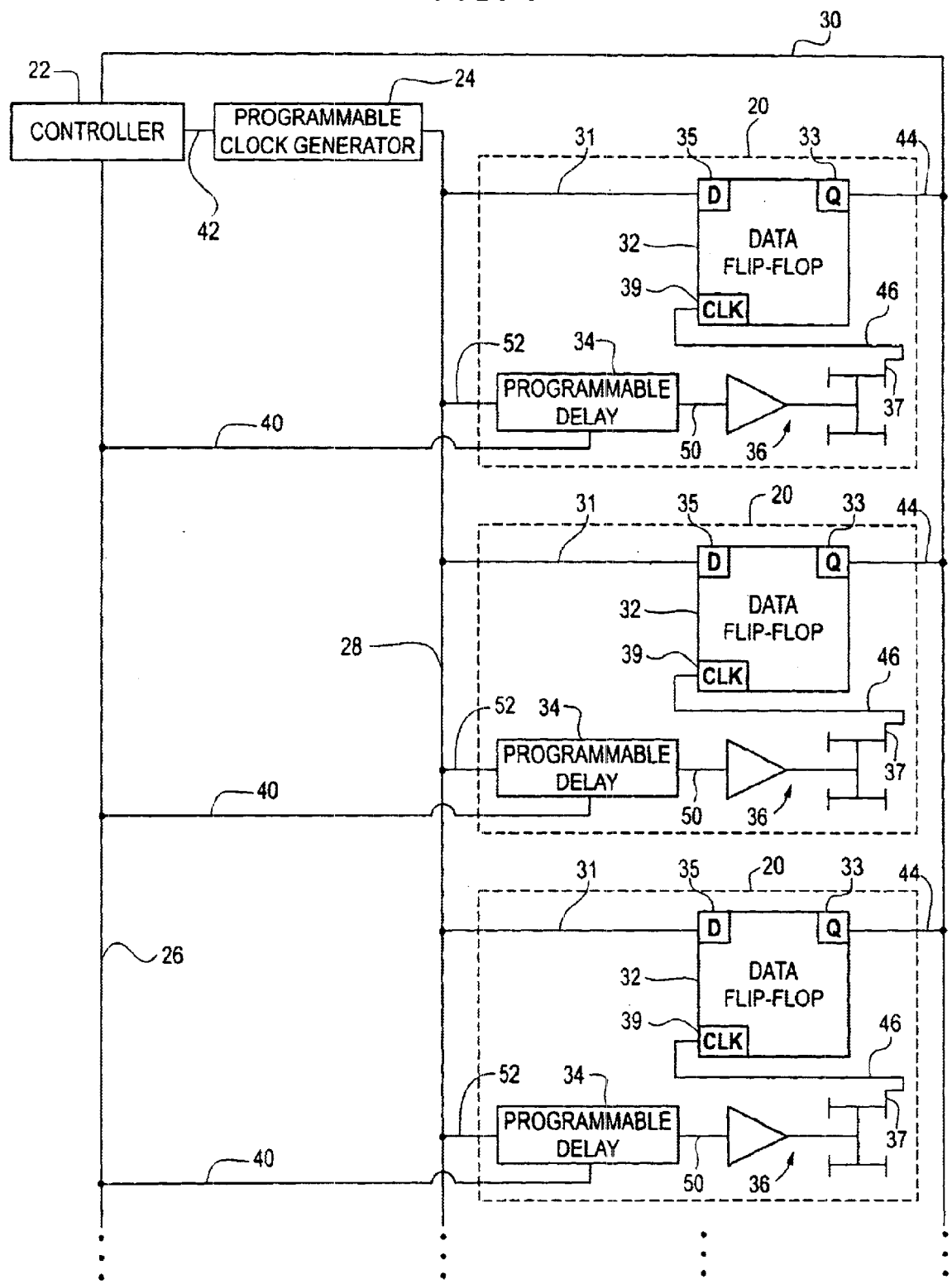
FIG. 1 is a schematic of an apparatus for adjusting the clock delay in systems with multiple ICs according to the present invention.

Referring to FIG. 1, an apparatus for adjusting the clock delay in systems with multiple integrated circuits according to the present invention includes a plurality of ICs 20, a controller 22 and a programmable clock generator 24. Three ICs 20 are shown in FIG. 1, although any number of ICs can be used in the present invention.

Each IC 20 includes a data flip-flop 32, a programmable delay 34 and a clock-fanout tree 36. Each data flip-flop 32 includes a data output terminal 33, a data input terminal 35 and a clock input terminal 39, represented in FIG. 1 by the terminals labeled Q, D, and CLK, respectively. Data flip-flops 32 are preferably rising edge triggered flip-flops, that output at data output terminal 33 the digital signal, either a logic 1 or 0, sampled at data input terminal 35 during any rising edge of the clock signal received at clock input terminal 39. If, for example, one of data flip-flops 32 receives a logic 1 during a rising edge of the clock signal received at clock input terminal 39, then data flip-flop 32 outputs a logic 1 signal from data output terminal 33. Data flip-flop 32 continues to output a logic 1 while logic 1 is received at clock input terminal 39 during subsequent rising edges received at clock input 39. If data flip-flop 32 receives a logic 0 during a rising edge, then the data flip-flop outputs a logic 0 signal from data output terminal 33 rather than a logic 1.

Although a data flip-flop is disclosed as a means for sampling the reference clock signal and comparing that clock signal with the clock signal received at the clocked elements of each IC, the present invention is not limited to using a data flip-flop for sampling the signals. For example, a latch could be used to sample the signals.

The data input terminal 35 of each data flip-flop 32 is connected to programmable clock generator 24 by a data input line 31. Data input lines 31 are connected to a programmable clock generator bus 28. The data output terminal 33 of each data flip-flop 32 is connected to controller 22 by a data output line 44. Data output lines 44 are connected to a controller data bus 30.

Each IC 20 includes a programmable delay 34. Each programmable delay 34 includes a series of buffers that may be selected or deselected to introduce different delays into a reference clock signal input. Programmable delays 34 are preferably programmable for a range of incremental delay settings. For example, programmable delays 34 may have delay settings ranging from zero to eight. A delay setting of zero would add no delay into a reference clock signal input, while a delay setting of eight would add eight increments of delay into a reference clock signal input. Programmable delays 34 can be programmed by controller 22. Each programmable delay 34 is preferably connected to controller 22 by a programmable delay line 40. Programmable delay lines 40 are connected to a controller delay bus 26.

Programmable delays 34 receive as input a reference clock signal generated by programable clock generator 24. Each programmable delay 34 is connected to programmable clock generator 24 by a programmable delay input line 52 and programmable clock generator bus 28. Each programmable delay 34 outputs a clock signal to a clock-fanout tree 36, and is connected to clock-fanout trees 36 by a programmable delay output line 50.

Each IC 20 includes a clock-fanout tree 36 that distributes the reference clock signal received by programmable delays 34 to the clocked elements of each IC 20 and to the clock input terminal 39 of each data flip-flop 32. According to the preferred embodiment of the invention, each clock-fanout tree 36 distributes the reference clock signal to one or more leaf terminals 37, that are connected to clocked elements of ICs 20. Each clock-fanout tree 36 distributes the reference clock signal to a data flip-flop 32 across a feedback line 46 connected between one leaf terminal 37 of each clock-fanout tree 36 and clock input terminal 39 of data flip-flop 32. Because both the clocked elements and data flip-flop 32 of each IC 20 receive a clock signal from leaf terminals 37, data flip-flops 32 in each IC 20 receive a clock signal having the same delay as the clock signal that is received by each of the clocked elements in that IC 20.

Controller 22 programs each programmable delay 34 to introduce a certain amount of delay into the reference clock signal received by the programmable delay 34 before the clock signal is distributed by clock-fanout trees 36 to the clocked elements. Controller 22 programs programmable delays 34 according to the data received by controller 22 from data output terminal 33 of each data flip-flop 32. A procedure for determining the amount of delay introduced by each programmable delay is described below.

Programmable clock generator 24 generates a reference clock signal that is routed to each IC 20. The frequency of the clock signal generated by programmable clock generator 24 depends on the instruction it receives from controller 22. Programmable clock generator 24 is connected to controller 22 by a controller line 42. Controller 22 can use a procedure described below for determining the frequency of the reference clock to be generated by programmable clock generator 24.

Figure 2:
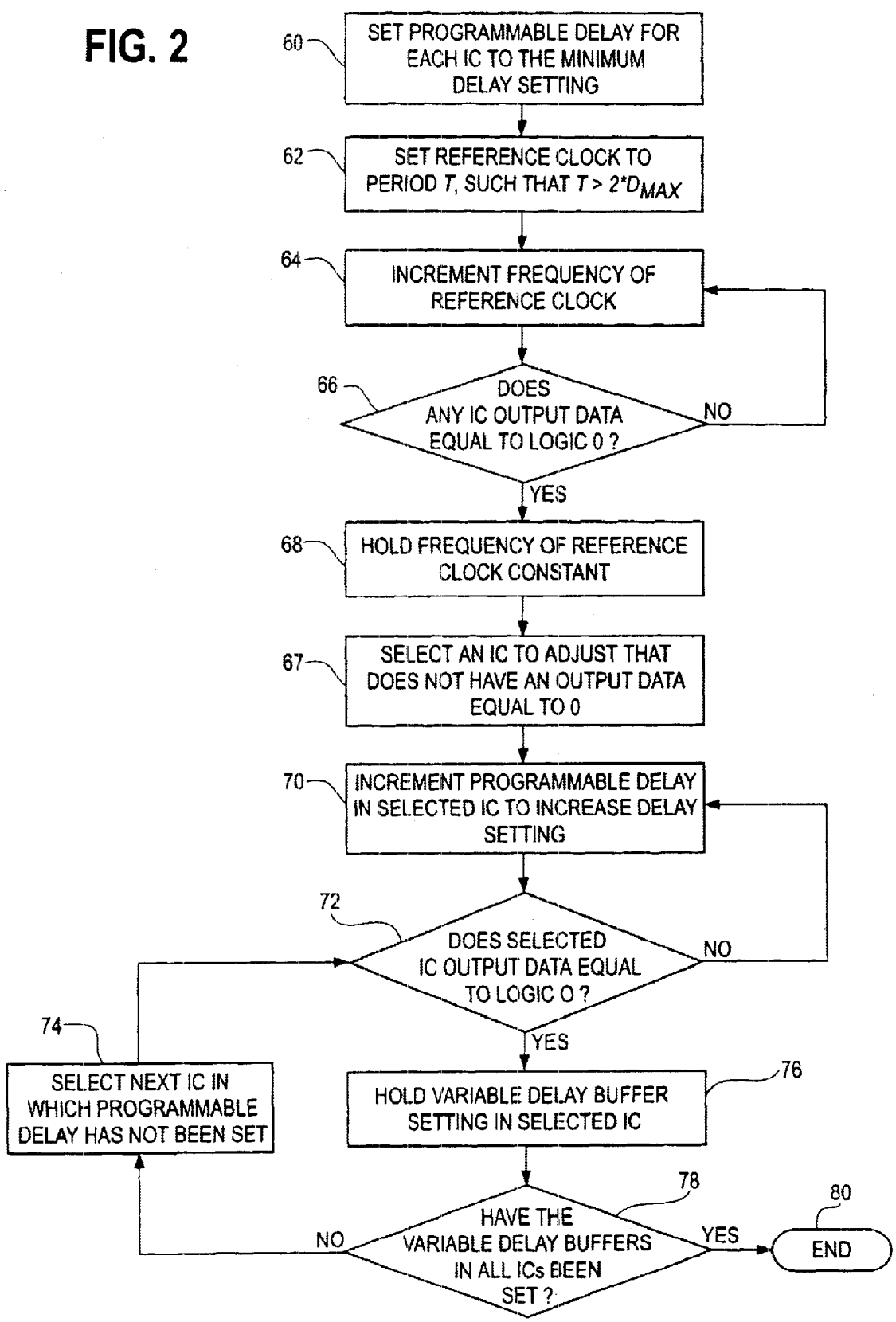
FIG. 2 is a flow chart illustrating a method for adjusting the clock delay in systems with multiple ICs according to the present invention.

A method for adjusting the clock delay in systems with multiple integrated circuits according to the present invention is illustrated in FIG. 2. As shown in block 60, controller 22 first sets the delay settings in programmable delays 34 of ICs 20 to the minimum incremental delay setting, e.g., zero. With the programmable delay set to zero, the delay of the clock signal received by clocked elements and data flip-flop 32 of each IC 20 will be equal to the inherent delay of each IC 20.

As shown in block 62, controller 22 programs programmable clock generator 24 to generate an initial reference clock signal having a period, T, that is greater than twice the maximum inherent delay, $\Delta_{max}$, in ICs 20. When the reference clock signal is initially set with a period, T, that is greater than twice the maximum inherent delay, $\Delta_{max}$, in ICs 20, all data flip-flops 32 will output a logic 1 from data output terminals 33 to controller 22.

After setting programmable delays 34 to a minimum delay setting and programming programmable clock generator 24 to generate an initial reference clock signal, controller 22 instructs programmable clock generator 24 to incrementally increase the reference clock frequency as shown in block 64. The amount programmable clock generator 24 increments the reference clock frequency depends on several factors. For example, if the initial reference clock frequency is 100 MHz, programmable clock generator may increase the frequency in 5 MHz increments. The frequency increment also depends on the resolution of programmable clock generator 24. One type of programmable clock generator 24 may be configured to increase frequency by increments of 10 MHz or greater. The frequency increment also depends on the acceptable clock delay tolerance in the system. If only a very small delay tolerance is acceptable in the system, programmable clock generator 24 may increase frequency in smaller increments than if a larger delay tolerance is acceptable. According to a preferred embodiment of the invention, controller 22 programs the programmable clock generator to increment the reference clock frequency by 1 MHz. The reference clock signal generated by programmable clock generator 24 is routed to ICs 20 where it is received at data input terminal 35 and clock input terminal 39 of data flip-flops 32.

Data flip-flops 32 sample the reference clock signal received at data input terminal 35 during rising edges of the clock signal received at clock input terminal 39. The clock signal received at clock input terminal 39 is delayed by the inherent delay of each IC 20. Depending on the logic state of the reference clock signal received at data input terminal 35 during a rising edge of the clock signal received at clock input terminal 39, data flip-flops 32 will output from output data terminal 33 a logic 1 or 0 to controller 22.

As shown in decision block 66, if none of data flip-flops 32 return a logic 0, then controller 22 instructs programmable clock generator to increment the reference clock frequency again. As the reference clock frequency is increased by controller 22, eventually the IC 20 with the most inherent delay switches from outputting a logic 1 to a logic 0 first in time.

Figure 3:
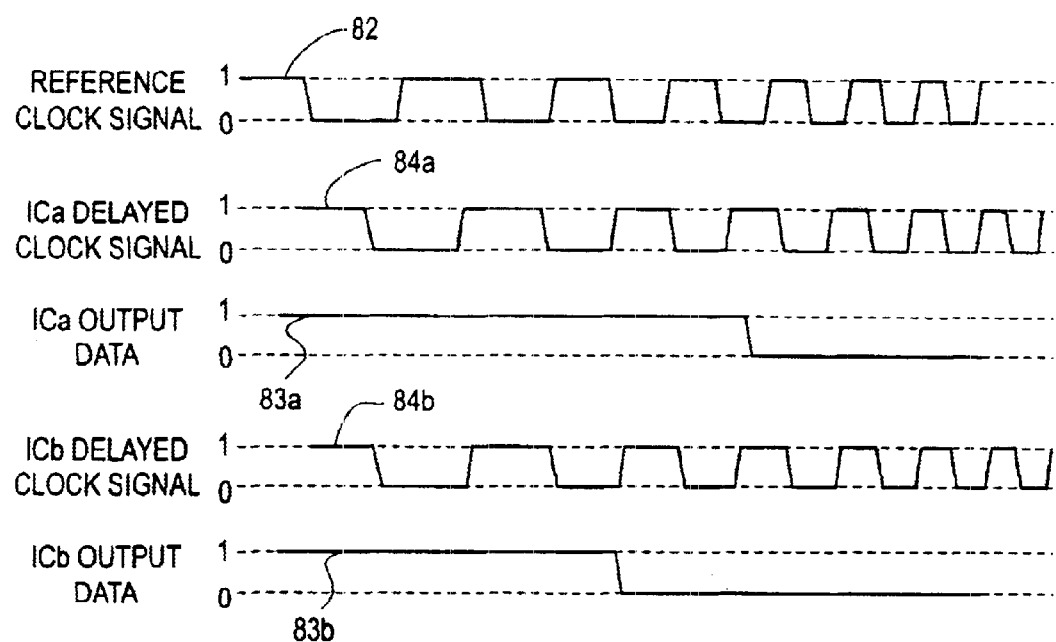
FIG. 3 is a clock signal timing diagram comparing, in time, a reference clock signal to delayed clock signals received by the data flip-flops in two ICs, to illustrate the step, according to the present invention, for identifying the most delayed IC.

FIG. 3 illustrates the process whereby IC 20 with the most inherent delay outputs a logic 0 first. Timing diagrams for two ICs 20 are shown in FIG. 3, although any number of ICs 20 can be used in the present invention. Reference clock signal 82 is the reference clock signal generated by programmable clock generator 24 and received by data flip-flops 32 at data input terminals 35. Clock signals 84a and 84b are the delayed clock signals that have been distributed by clock-fanout trees 37 and received by data flip-flops 32 at clock input terminals 39 for two ICs 20, ICa and ICb. Output signals 83a and 83b are the output of data flip-flops 32 for ICa and ICb from output terminals 33. Prior to incrementing the initial frequency of reference clock 82, output signals 83a and 83b output a logic 1 because initially during the rising edges of clocks signals 84a and 84b, reference clock 82 is equal to logic 1. As controller 20 incrementally increases the frequency of reference clock 82 in subsequent reference clock cycles, the period of reference clock 82 decreases. Eventually reference clock 82 has a value of logic 0 during the rising edge of at least one of clock signals 84a and 84b, causing output signals 83a and 83b to switch from logic 1 to logic 0. The output signal for the more delayed IC 20 will switch from logic 1 to logic 0 first in time. In FIG. 3, output signal 83b switches from logic 1 to logic 0 before output signal 83a, indicating that ICb has longer inherent delay than ICa. In this manner, the IC 20 with the most inherent delay is identified.

After controller 22 receives a logic 0 from the most delayed IC 20, controller 22 holds the frequency of the reference clock constant, as shown in block 68. As shown in block 67, controller 22 then selects each IC 20 that does not output a logic 0, and adjusts the programmable delays 34 in each IC 20 so that all ICs 20 have delays equal to the delay of the most delayed IC 20. To equalize the delays in ICs 20, at block 69 controller 22 selects one of ICs 20 that are not already outputting a logic 1 to adjust, and increments the programmable delay 34 in that IC 20 by one delay setting, as shown in block 70. As shown in block 72, controller 22 then checks whether data flip-flop 32 in the selected IC 20 outputs a logic 0. If the selected IC 20 does not output a logic 0, then controller 22 increments the programmable delay 34 in that IC 20 again, and checks whether the data flip-flop in the selected IC 20 outputs a logic 0. This process continues until the selected IC 20 outputs a logic 0, at which time controller 22 holds the delay setting in programmable delay 34 for the selected IC 20 at the delay setting that resulted in the output switching from logic 1 to logic 0, as shown in block 76. Controller 22 repeats this procedure for all ICs 20 until programmable delays 34 in all ICs have been equalized, as shown in blocks 78 and 74. When controller 22 has set the delay settings for all programmable delays 34 in all ICs 20, the procedure is complete and the reference clock signal may be set to the desired system operating frequency.

The method and apparatus for adjusting the clock delay in systems with multiple integrated circuits according to the present invention overcomes the limitations of existing methods and apparatuses. The present invention provides a method and apparatus for adjusting clock delay in systems having multiple ICs wherein the system will not become misaligned when the frequency of the reference clock changes. The method and apparatus of the present invention adjusts the clock delay in systems with multiple ICs by identifying the IC with the most inherent delay, and then adding delay to the clock distribution in the other ICs so that all of the ICs have the same delay as the most delayed IC. Because the method and apparatus of the present invention equalizes the delay in all of the ICs, rather than continuously adjusting for zero phase delay, the clock alignment is independent of the frequency of the reference clock. The method and apparatus of the present invention is therefore advantageous over existing methods and apparatuses because the frequency of the reference clock can be changed without losing clock synchronization.

Whereas the present invention has been described with respect to specific embodiments thereof, it will be understood that various changes and modifications will be suggested to one skilled in the art and it is intended that the invention encompass such changes and modifications as fall within the scope of the appended claims.

What is claimed is:

1. An apparatus for adjusting the clock delay in a system having multiple integrated circuits, comprising:
    a clock generator for generating a first clock signal;
    a controller for controlling the frequency of said first clock signal;
    means for creating a second clock signal, wherein said second clock signal is derived from said first clock signal;
    means for sampling said first clock signal at a time determined by said second clock signal; and
    means for comparing said sampled first clock signal to a predetermined value.

2. The apparatus of claim 1 wherein said second clock signal is a delay of said first clock signal.

3. The apparatus of claim 1 wherein said sampling means samples said first clock signal when said second clock signal changes from a first logic state to a second logic state.

4. The apparatus of claim 1 wherein said sampling means comprises a flip-flop.

5. The apparatus of claim 1 wherein said sampling means comprises a latch.

6. The apparatus of claim 1 wherein said comparing means compares said first clock signal to a predetermined value to determine whether said first clock signal has changed from a first logic state to a second logic state.

7. An apparatus for adjusting the clock delay in a system having multiple integrated circuits, comprising:
    a programmable clock generator for generating a first clock signal;
    a plurality of integrated circuits, each of said integrated circuits including:
        (a) means for creating a respective second clock signal, wherein each said respective second clock signal is derived from said first clock signal; and
        (b) means for sampling said first clock signal at a time determined by said respective second clock signal; and
    means for comparing each of said sampled first clock signals to a predetermined value.

8. The apparatus of claim 7 wherein each said integrated circuit includes a programmable delay.

9. The apparatus of claim 8 further comprising a controller for programming said programmable delay.

10. A method for adjusting clock delay in a system having multiple integrated circuits, each integrated circuit having a programmable delay for adding a programmable amount of delay to a clock signal distributed throughout the integrated circuit and having a data flip-flop, comprising the steps of:
    (a) setting the delay settings in the programmable delays of the integrated circuits to an initial delay;
    (b) generating a first clock signal;
    (c) routing the first clock signal to the integrated circuits;
    (d) in each integrated circuit, deriving a respective second clock signal from the first clock signal;
    (e) in each integrated circuit, distributing the respective second clock signal to clocked elements in the integrated circuit;
    (f) setting the first clock signal to an initial frequency such that the period of the first clock signal is greater than twice the maximum inherent delay of the integrated circuits;
    (g) in each integrated circuit, sampling the first clock signal at a time determined by the respective second clock signal;
    (h) incrementally increasing the frequency of the first clock signal until the sampled first clock signal from one of the integrated circuits is a predetermined value;
    (i) subsequently holding the frequency of the first clock signal constant;
    (j) selecting one of the integrated circuits to adjust;
    (k) incrementally increasing the delay setting of programmable delay in the selected integrated circuit to alter the respective second clock signal;
    (l) sampling the first clock signal at a time determined by the respective second clock signal in the selected integrated circuit;
    (m) incrementally increasing the delay setting of the programmable delay in the selected integrated circuit until the sampled first clock signal is a predetermined value;

(n) holding the delay setting of the programmable delay of the selected integrated circuit constant;

(o) selecting another integrated circuit to adjust and repeating step (j) through step (n) until all integrated circuits have been adjusted.

11. The method of claim 10 wherein step (a) comprises setting the delay settings in the programmable delays of the integrated circuits to zero delay.

12. A method for determining which of a plurality of integrated circuits has the longest inherent delay, comprising the steps of:

(a) setting the delay settings in the programmable delays of the integrated circuits to an initial delay;

(b) generating a first clock signal;

(c) routing the first clock signal to the integrated circuits;

(d) in each integrated circuit, deriving a respective second clock signal from the first clock signal;

(e) in each integrated circuit, distributing the respective second clock signal to clocked elements in the integrated circuit;

(f) setting the first clock signal to an initial frequency such that the period of the first clock signal is greater than twice the maximum inherent delay of the integrated circuits;

(g) in each integrated circuit, sampling the first clock signal at a time determined by the respective second clock signal; and (h) incrementally increasing the frequency of the first clock signal until the sampled first clock signal from one of the integrated circuits is a predetermined value.

13. The method of claim 12 wherein step (a) comprises setting the delay settings in the programmable delays of the integrated circuits to zero delay.

* * * * *